US007642787B2

(12) United States Patent
Bertness et al.

(10) Patent No.: US 7,642,787 B2
(45) Date of Patent: Jan. 5, 2010

(54) AUTOMOTIVE VEHICLE ELECTRICAL SYSTEM DIAGNOSTIC DEVICE

(75) Inventors: Kevin I. Bertness, Batavia, IL (US); William G. Sampson, Lombard, IL (US)

(73) Assignee: Midtronics Inc., Willowbrook, IL (US)

( * ) Notice: Subject to any disclaimer, the term of this patent is extended or adjusted under 35 U.S.C. 154(b) by 349 days.

(21) Appl. No.: 11/585,675

(22) Filed: Oct. 24, 2006

(65) Prior Publication Data
US 2007/0159177 A1 Jul. 12, 2007

Related U.S. Application Data

(60) Division of application No. 10/200,041, filed on Jul. 19, 2002, now Pat. No. 7,126,341, and a continuation-in-part of application No. 10/046,659, filed on Nov. 29, 2001, now Pat. No. 6,909,287, which is a division of application No. 09/564,740, filed on May 4, 2000, now Pat. No. 6,331,762, which is a continuation-in-part of application No. 08/962,754, filed on Nov. 3, 1997, now Pat. No. 6,081,098, said application No. 10/046,659 is a continuation-in-part of application No. 09/575,627, filed on May 22, 2000, now Pat. No. 6,313,608, which is a continuation-in-part of application No. 08/962,754, filed on Nov. 3, 1997, now Pat. No. 6,081,098, said application No. 10/200,041 is a continuation-in-part of application No. 09/816,768, filed on Mar. 23, 2001, now Pat. No. 6,586,941.

(60) Provisional application No. 60/132,622, filed on May 5, 1999, provisional application No. 60/165,208, filed on Nov. 12, 1999, provisional application No. 60/175,762, filed on Jan. 12, 2000, provisional application No. 60/192,222, filed on Mar. 27, 2000.

(51) Int. Cl.
*G01N 27/416* (2006.01)

(52) U.S. Cl. ............... 324/426; 324/427; 324/429; 324/430

(58) Field of Classification Search ............... 701/29, 701/36; 702/60, 63–65; 320/134, 136; 324/426–437; 340/636.1–636.21
See application file for complete search history.

(56) References Cited

U.S. PATENT DOCUMENTS 2,000,665 A  5/1935  Neal .................. 439/440

(Continued)

FOREIGN PATENT DOCUMENTS

EP  0 022 450 A1  1/1981

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner*—Jeffrey L Sterrett
*Assistant Examiner*—Fred E Finch, III
(74) *Attorney, Agent, or Firm*—Westman, Champlin & Kelly, P.A.

(57) ABSTRACT

An automotive vehicle electrical system diagnostic apparatus includes first and second electrical connections configured to electrically couple to an electrical system of an automotive vehicle which includes a battery. Digital samples are obtained during operation of the vehicle which are related to the system. The digital samples are stored in memory.

34 Claims, 8 Drawing Sheets

U.S. PATENT DOCUMENTS

| | | | |
|---|---|---|---|
| 2,417,940 A | 3/1947 | Lehman | 200/61.25 |
| 2,514,745 A | 7/1950 | Dalzell | 324/115 |
| 2,727,221 A | 12/1955 | Springg | 340/447 |
| 3,178,686 A | 4/1965 | Mills | 340/447 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,776,177 A * | 12/1973 | Bryant et al. | 116/311 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,850,490 A | 11/1974 | Zehr | 439/822 |
| 3,873,911 A | 3/1975 | Champlin | 324/430 |
| 3,876,931 A | 4/1975 | Godshalk | 324/429 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 702/63 |
| 4,280,457 A | 7/1981 | Bloxham | 123/198 R |
| 4,297,639 A * | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |

| Patent | Date | Inventor | Ref |
|---|---|---|---|
| 5,159,272 A | 10/1992 | Rao et al. | 324/429 |
| 5,160,881 A | 11/1992 | Schramm et al. | 322/7 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,432,025 A | 7/1995 | Cox | 429/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,717,336 A | 2/1998 | Basell et al. | 324/430 |
| 5,717,937 A | 2/1998 | Fritz | 713/300 |
| 5,739,667 A | 4/1998 | Matsuda et al. | 320/128 |
| 5,744,962 A * | 4/1998 | Alber et al. | 324/426 |
| 5,745,044 A | 4/1998 | Hyatt, Jr. et al. | 340/5.23 |
| 5,747,189 A | 5/1998 | Perkins | 429/61 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |

| | | | | | | |
|---|---|---|---|---|---|---|
| 5,939,855 A | 8/1999 | Proctor et al. ............... 320/104 | 6,294,897 B1 | 9/2001 | Champlin ................... 320/153 |
| 5,939,861 A | 8/1999 | Joko et al. .................. 320/122 | 6,304,087 B1 | 10/2001 | Bertness ..................... 324/426 |
| 5,945,829 A | 8/1999 | Bertness .................... 324/430 | 6,307,349 B1 | 10/2001 | Koenck et al. ............... 320/112 |
| 5,946,605 A | 8/1999 | Takahisa et al. .............. 455/68 | 6,310,481 B2 | 10/2001 | Bertness ..................... 324/430 |
| 5,951,229 A | 9/1999 | Hammerslag ................ 414/398 | 6,313,607 B1 | 11/2001 | Champlin ................... 320/132 |
| 5,961,561 A | 10/1999 | Wakefield, II ................ 701/29 | 6,313,608 B1 | 11/2001 | Varghese et al. ............ 320/132 |
| 5,961,604 A | 10/1999 | Anderson et al. ........... 709/229 | 6,316,914 B1 | 11/2001 | Bertness ..................... 320/134 |
| 5,969,625 A | 10/1999 | Russo .................... 340/636.19 | 6,320,351 B1 | 11/2001 | Ng et al. ..................... 320/104 |
| 5,978,805 A | 11/1999 | Carson ........................ 707/10 | 6,323,650 B1 | 11/2001 | Bertness et al. ............. 324/426 |
| 5,982,138 A | 11/1999 | Krieger ...................... 320/105 | 6,329,793 B1 | 12/2001 | Bertness et al. ............. 320/132 |
| 6,002,238 A | 12/1999 | Champlin ................... 320/134 | 6,331,762 B1 | 12/2001 | Bertness ..................... 320/134 |
| 6,005,759 A | 12/1999 | Hart et al. ..................... 361/66 | 6,332,113 B1 | 12/2001 | Bertness ....................... 702/63 |
| 6,008,652 A | 12/1999 | Theofanopoulos et al. ... 324/434 | 6,346,795 B2 | 2/2002 | Haraguchi et al. .......... 320/136 |
| 6,009,369 A | 12/1999 | Boisvert et al. ............... 701/99 | 6,347,958 B1 | 2/2002 | Tsai .............................. 439/488 |
| 6,016,047 A | 1/2000 | Notten et al. ................. 320/137 | 6,351,102 B1 | 2/2002 | Troy ............................ 320/139 |
| 6,031,354 A | 2/2000 | Wiley et al. .................. 320/116 | 6,356,042 B1 | 3/2002 | Kahlon et al. ................ 318/138 |
| 6,031,368 A | 2/2000 | Klippel et al. ............... 324/133 | 6,359,441 B1 | 3/2002 | Bertness ..................... 324/426 |
| 6,037,745 A | 3/2000 | Koike et al. .................. 320/104 | 6,359,442 B1 | 3/2002 | Henningson et al. ........ 324/426 |
| 6,037,749 A | 3/2000 | Parsonage ................... 320/132 | 6,363,303 B1 | 3/2002 | Bertness ........................ 701/29 |
| 6,037,751 A | 3/2000 | Klang ......................... 320/160 | RE37,677 E | 4/2002 | Irie ................................ 315/83 |
| 6,037,777 A | 3/2000 | Champlin ................... 324/430 | 6,377,031 B1 | 4/2002 | Karuppana et al. .......... 323/220 |
| 6,037,778 A | 3/2000 | Makhija ...................... 324/433 | 6,384,608 B1 | 5/2002 | Namaky ...................... 324/430 |
| 6,046,514 A | 4/2000 | Rouillard et al. ............... 307/77 | 6,388,448 B1 | 5/2002 | Cervas ......................... 324/426 |
| 6,051,976 A | 4/2000 | Bertness ..................... 324/426 | 6,392,414 B2 | 5/2002 | Bertness ..................... 324/429 |
| 6,055,468 A * | 4/2000 | Kaman et al. ................. 701/29 | 6,396,278 B1 | 5/2002 | Makhija ...................... 324/402 |
| 6,061,638 A | 5/2000 | Joyce ........................... 702/63 | 6,407,554 B1 | 6/2002 | Godau et al. ................ 324/503 |
| 6,064,372 A | 5/2000 | Kahkoska ................... 345/173 | 6,411,098 B1 | 6/2002 | Laletin ........................ 324/436 |
| 6,072,299 A | 6/2000 | Kurle et al. .................. 320/112 | 6,417,669 B1 | 7/2002 | Champlin ................... 324/426 |
| 6,072,300 A | 6/2000 | Tsuji ........................... 320/116 | 6,424,157 B1 | 7/2002 | Gollomp et al. ............. 324/430 |
| 6,081,098 A | 6/2000 | Bertness et al. ............. 320/134 | 6,424,158 B2 | 7/2002 | Klang ......................... 324/433 |
| 6,081,109 A | 6/2000 | Seymour et al. ............. 324/127 | 6,437,957 B1 | 8/2002 | Karuppana et al. ............ 361/78 |
| 6,087,815 A | 7/2000 | Pfeifer et al. ................. 323/282 | 6,441,585 B1 | 8/2002 | Bertness ..................... 320/132 |
| 6,091,238 A | 7/2000 | McDermott ............... 324/207.2 | 6,445,158 B1 | 9/2002 | Bertness et al. ............. 320/104 |
| 6,091,245 A | 7/2000 | Bertness ..................... 324/426 | 6,449,726 B1 | 9/2002 | Smith .......................... 713/340 |
| 6,094,033 A | 7/2000 | Ding et al. ................... 320/132 | 6,456,036 B1 | 9/2002 | Thandiwe ................... 320/106 |
| 6,100,670 A | 8/2000 | Levesque .................... 320/150 | 6,456,045 B1 | 9/2002 | Troy et al. ................... 320/139 |
| 6,104,167 A | 8/2000 | Bertness et al. ............. 320/132 | 6,465,908 B1 | 10/2002 | Karuppana et al. ............ 307/31 |
| 6,113,262 A | 9/2000 | Purola et al. ................... 374/45 | 6,466,025 B1 | 10/2002 | Klang ......................... 324/429 |
| 6,114,834 A | 9/2000 | Parise ......................... 320/109 | 6,466,026 B1 | 10/2002 | Champlin ................... 324/430 |
| 6,137,269 A | 10/2000 | Champlin ................... 320/150 | 6,469,511 B1 | 10/2002 | Vonderhaar et al. ......... 324/425 |
| 6,140,797 A | 10/2000 | Dunn .......................... 320/105 | 6,477,478 B1 | 11/2002 | Jones et al. .................. 702/102 |
| 6,144,185 A | 11/2000 | Dougherty et al. .......... 320/132 | 6,495,990 B2 | 12/2002 | Champlin ................... 320/132 |
| 6,150,793 A | 11/2000 | Lesesky et al. .............. 320/104 | 6,497,209 B1 | 12/2002 | Karuppana et al. ....... 123/179.3 |
| 6,158,000 A | 12/2000 | Collins ........................... 713/1 | 6,500,025 B1 | 12/2002 | Moenkhaus et al. ......... 439/502 |
| 6,161,640 A | 12/2000 | Yamaguchi ................. 180/65.8 | 6,505,507 B1 | 1/2003 | Imao .......................... 73/146.5 |
| 6,163,156 A | 12/2000 | Bertness ..................... 324/426 | 6,507,196 B2 | 1/2003 | Thomsen et al. ............ 324/436 |
| 6,164,063 A | 12/2000 | Mendler ........................ 60/274 | 6,526,361 B1 | 2/2003 | Jones et al. .................... 702/63 |
| 6,167,349 A | 12/2000 | Alvarez ........................ 702/63 | 6,529,723 B1 | 3/2003 | Bentley ...................... 455/405 |
| 6,172,483 B1 | 1/2001 | Champlin ................... 320/134 | 6,531,848 B1 | 3/2003 | Chitsazan et al. ........... 320/153 |
| 6,172,505 B1 | 1/2001 | Bertness ..................... 324/430 | 6,532,425 B1 | 3/2003 | Boost et al. ................... 702/63 |
| 6,177,737 B1 | 1/2001 | Palfey et al. ................... 307/64 | 6,534,993 B2 | 3/2003 | Bertness ..................... 324/433 |
| 6,181,545 B1 | 1/2001 | Amatucci et al. ............ 361/502 | 6,544,078 B2 | 4/2003 | Palmisano et al. .......... 439/762 |
| 6,211,651 B1 | 4/2001 | Nemoto ...................... 320/133 | 6,545,599 B2 | 4/2003 | Derbyshire et al. ......... 340/442 |
| 6,215,275 B1 | 4/2001 | Bean ........................... 320/106 | 6,556,019 B2 | 4/2003 | Bertness ..................... 324/426 |
| 6,218,936 B1 | 4/2001 | Imao ........................... 340/447 | 6,566,883 B1 | 5/2003 | Vonderhaar et al. ......... 324/426 |
| 6,222,342 B1 | 4/2001 | Eggert et al. ................ 320/105 | 6,570,385 B1 | 5/2003 | Roberts et al. .............. 324/378 |
| 6,222,369 B1 | 4/2001 | Champlin ................... 324/430 | 6,577,107 B2 | 6/2003 | Kechmire ................... 320/139 |
| D442,503 S | 5/2001 | Lundbeck et al. ............ D10/77 | 6,586,941 B2 | 7/2003 | Bertness et al. ............. 324/426 |
| 6,225,808 B1 | 5/2001 | Varghese et al. ............ 324/426 | 6,597,150 B1 | 7/2003 | Bertness et al. ............. 320/104 |
| 6,236,332 B1 | 5/2001 | Conkright et al. ............ 340/3.1 | 6,599,243 B2 | 7/2003 | Woltermann et al. ........ 600/300 |
| 6,238,253 B1 | 5/2001 | Qualls ........................ 439/759 | 6,600,815 B1 | 7/2003 | Walding .................. 379/93.07 |
| 6,242,887 B1 | 6/2001 | Burke ......................... 320/104 | 6,611,740 B2 | 8/2003 | Lowrey et al. ................ 701/29 |
| 6,249,124 B1 | 6/2001 | Bertness ..................... 324/426 | 6,618,644 B2 | 9/2003 | Bean ........................... 700/231 |
| 6,250,973 B1 | 6/2001 | Lowery et al. .............. 439/763 | 6,621,272 B2 | 9/2003 | Champlin ................... 324/426 |
| 6,254,438 B1 | 7/2001 | Gaunt ......................... 439/755 | 6,623,314 B1 | 9/2003 | Cox et al. .................... 439/759 |
| 6,259,170 B1 | 7/2001 | Limoge et al. ............. 307/10.8 | 6,624,635 B1 | 9/2003 | Lui ............................. 324/426 |
| 6,259,254 B1 | 7/2001 | Klang ......................... 324/427 | 6,628,011 B2 | 9/2003 | Droppo et al. ................. 307/43 |
| 6,262,563 B1 | 7/2001 | Champlin ................... 320/134 | 6,629,054 B2 | 9/2003 | Makhija et al. ............. 702/113 |
| 6,263,268 B1 | 7/2001 | Nathanson .................... 701/29 | 6,633,165 B2 | 10/2003 | Bertness ..................... 324/426 |
| 6,271,643 B1 | 8/2001 | Becker et al. ................ 320/112 | 6,635,974 B1 | 10/2003 | Karuppana et al. .......... 307/140 |
| 6,271,748 B1 | 8/2001 | Derbyshire et al. ......... 340/442 | 6,667,624 B1 | 12/2003 | Raichle et al. .............. 324/522 |
| 6,275,008 B1 | 8/2001 | Arai et al. ................... 320/132 | 6,679,212 B2 | 1/2004 | Kelling ................... 123/179.28 |
| 6,294,896 B1 | 9/2001 | Champlin ................... 320/134 | 6,686,542 B2 | 2/2004 | Zhang ........................... 174/74 |

| | | | |
|---|---|---|---|
| 6,696,819 B2 | 2/2004 | Bertness | 320/134 |
| 6,707,303 B2 | 3/2004 | Bertness et al. | 324/426 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/31 |
| 6,745,153 B2 | 6/2004 | White et al. | 702/184 |
| 6,759,849 B2 | 7/2004 | Bertness et al. | 324/426 |
| 6,777,945 B2 | 8/2004 | Roberts et al. | 324/426 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,842,707 B2 | 1/2005 | Raichle et al. | 702/62 |
| 6,850,037 B2 | 2/2005 | Bertness | 320/132 |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/426 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,967,484 B2 | 11/2005 | Bertness | 324/426 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2 | 3/2006 | Smith et al. | 324/426 |
| 7,058,525 B2 | 6/2006 | Bertness et al. | 702/63 |
| 7,081,755 B2 | 7/2006 | Klang et al. | 324/426 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,126,341 B2 | 10/2006 | Bertness et al. | 324/426 |
| 7,129,706 B2 | 10/2006 | Kalley | 324/426 |
| 7,272,519 B2 | 9/2007 | Lesesky et al. | 702/63 |
| 2002/0004694 A1 | 1/2002 | Mcleod | 701/29 |
| 2002/0010558 A1 | 1/2002 | Bertness et al. | 702/63 |
| 2002/0041175 A1 | 4/2002 | Lauper et al. | 320/106 |
| 2002/0044050 A1 | 4/2002 | Derbyshire et al. | 340/442 |
| 2002/0171428 A1 | 11/2002 | Bertness | 702/63 |
| 2002/0176010 A1 | 11/2002 | Wallach et al. | 348/362 |
| 2003/0009270 A1 | 1/2003 | Breed | 701/29 |
| 2003/0025481 A1 | 2/2003 | Bertness | 324/427 |
| 2003/0036909 A1 | 2/2003 | Kato | 704/275 |
| 2003/0088375 A1 | 5/2003 | Bertness et al. | 702/63 |
| 2003/0169018 A1 | 9/2003 | Berels et al. | 320/132 |
| 2003/0184262 A1 | 10/2003 | Makhija | 320/156 |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0214395 A1 | 11/2003 | Flowerday et al. | 340/445 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0044452 A1 | 3/2004 | Bauer et al. | 703/33 |
| 2004/0049361 A1 | 3/2004 | Hamdan et al. | 702/115 |
| 2004/0051533 A1 | 3/2004 | Namaky | 324/426 |
| 2004/0054503 A1 | 3/2004 | Namaky | 702/182 |
| 2004/0113588 A1 | 6/2004 | Mikuriya et al. | 320/128 |
| 2004/0145342 A1 | 7/2004 | Lyon | 320/108 |
| 2004/0178185 A1 | 9/2004 | Yoshikawa et al. | 219/270 |
| 2004/0239332 A1 | 12/2004 | Mackel et al. | 324/426 |
| 2005/0043868 A1 | 2/2005 | Mitcham | 701/29 |
| 2005/0102073 A1 | 5/2005 | Ingram | 701/29 |
| 2005/0182536 A1 | 8/2005 | Doyle et al. | 701/29 |
| 2005/0254106 A9 | 11/2005 | Silverbrook et al. | 358/539 |
| 2005/0256617 A1 | 11/2005 | Cawthorne et al. | 701/22 |
| 2006/0030980 A1 | 2/2006 | St. Denis | 701/29 |
| 2006/0089767 A1 | 4/2006 | Sowa | 701/29 |
| 2006/0217914 A1 | 9/2006 | Bertness | 702/113 |

FOREIGN PATENT DOCUMENTS

| | | | |
|---|---|---|---|
| EP | 0 637 754 A1 | | 2/1995 |
| EP | 0 982 159 A2 | | 3/2000 |
| FR | 2 749 397 | | 12/1997 |
| GB | 2 029 586 | | 3/1980 |
| GB | 2 088 159 A | | 6/1982 |
| GB | 2 246 916 A | | 10/1990 |
| GB | 2 275 783 A | | 7/1994 |
| GB | 2 387 235 A | | 10/2003 |
| JP | 59-17892 | | 1/1984 |
| JP | 59-17893 | | 1/1984 |
| JP | 59-17894 | | 1/1984 |
| JP | 59017894 | | 1/1984 |
| JP | 59215674 | | 12/1984 |
| JP | 60225078 | | 11/1985 |
| JP | 62-180284 | | 8/1987 |
| JP | 63027776 | | 2/1988 |
| JP | 03274479 | | 12/1991 |
| JP | 03282276 | | 12/1991 |
| JP | 4-8636 | | 1/1992 |
| JP | 04095788 | | 3/1992 |
| JP | 04131779 | | 5/1992 |
| JP | 04372536 | | 12/1992 |
| JP | 05211724 A | | 8/1993 |
| JP | 5216550 | | 8/1993 |
| JP | 7-128414 | | 5/1995 |
| JP | 09061505 | | 3/1997 |
| JP | 10056744 | | 2/1998 |
| JP | 10232273 | | 9/1998 |
| JP | 11103503 A | | 4/1999 |
| RU | 2089015 C1 | | 8/1997 |
| WO | WO 93/22666 | | 11/1993 |
| WO | WO 94/05069 | | 3/1994 |
| WO | WO 96/01456 | | 1/1996 |
| WO | WO 96/06747 | | 3/1996 |
| WO | WO 97/01103 | * | 1/1997 |
| WO | WO 97/44652 | | 11/1997 |
| WO | WO 98/04910 | | 2/1998 |
| WO | WO 98/58270 | | 12/1998 |
| WO | WO 99/23738 | | 5/1999 |
| WO | WO 00/16083 | | 3/2000 |
| WO | WO 00/62049 | | 10/2000 |
| WO | WO 00/67359 | | 11/2000 |
| WO | WO 01/59443 | | 2/2001 |
| WO | WO 01/16614 | | 3/2001 |
| WO | WO 01/16615 | | 3/2001 |
| WO | WO 01/51947 | | 7/2001 |
| WO | WO 03/047064 A3 | | 6/2003 |
| WO | WO 03/076960 A1 | | 9/2003 |
| WO | WO 2004/047215 A1 | | 6/2004 |

OTHER PUBLICATIONS

"Battery Impedance", by E. Willihnganz et al., *Electrical Engineering*, Sep. 1959, pp. 922-925.

"Determining the End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, p. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.335.2:629.113.006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measureing Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5.

Burr-Brown Corporation, "Design A 60 Hz Notch Filter with the UAF42", Jan. 1994, AB-071, 1994.

National Semiconductor Corporation, "LMF90-4$^{th}$-Order Elliptic Notch Filter", Dec. 1994. RRD-B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC-DC Converts Allows Use of Single Battery", *Electronix Express*, downloaded from http://www.elexp.com/t_dc-dc.htm, undated.

"DC-DC Converter Basics", *Power Designers*, downloaded from http://www.powederdesigners.com/InforWeb.design_center/articles/DC-DC/converter.shtm, undated.

"Notification of Transmittal of The International Search Report or the Declaration", PCT/US02/29461.

"Notification of Transmittal of The International Search Report or the Declaration", PCT/US03/07546.

"Notification of Transmittal of The International Search Report or the Declaration", PCT/US03/06577.

"Notification of Transmittal of The International Search Report or the Declaration", PCT/US03/07837.

"Improved Impedance Spectroscopy Technique For Status Determination of Production Li/SO$_2$ Batteries" Terrill Atwater et al., pp. 10-113, (1992).

"Notification of Transmittal of the International Search Report or the Declaration", PCT/US03/27696.

"Notification of Transmittal of the International Search Report or the Declaration", PCT/US03/41561.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois, pp. 1-1-14-13, (1991).

Supplementary European Search Report Communication for Appl. No. 99917402.2.

"Dynamic modelling of lead/acid batteries using impedance spectroscopy for parameter identification", Journal of Power Sources, pp. 69-84, (1997).

Notification of Transmittal of the International Search Report for PCT/US03/30707.

"A review of impedance measurements for determination of the state-of-charge or state-of-health of secondary batteries", Journal of Power Sources, pp. 59-69, (1998).

"Search Report Under Section 17" for Great Britain Application No. GB0421447.4.

"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.

"Examination Report" from the U.K. Patent Office for U.K. App. No. 0417678.0.

Wikipedia Online Encyclopedia, Inductance, 2005, http://en.wikipedia.org/wiki/inductance, pp. 1-5, mutual Inductance, pp. 3,4.

Young Illustrated Encyclopedia Dictionary of Electronics, 1981, Parker Publishing Company, Inc., pp. 318-319.

* cited by examiner

AUTOMOTIVE VEHICLE ELECTRICAL SYSTEM DIAGNOSTIC DEVICE

The present application is a divisional of application Ser. No. 10/200,041, filed Jul. 19, 2002 and is a Continuation-in-Part of application Ser. No. 10/046,659, filed Oct. 29, 2001 which is a divisional of application Ser. No. 09/564,740, filed May 4, 2000, now U.S. Pat. No. 6,331,762, which claims priority to Provisional Application Ser. No. 60/132,622, filed May 5, 1999, and entitled AUTOMOTIVE VEHICLE BATTERY CHARGING SYSTEM; U.S. Provisional Application No. 60/165,208, filed Nov. 12, 1999, and entitled ENERGY MANAGEMENT SYSTEM FOR AUTOMOTIVE VEHICLE; and Provisional Application Ser. No. 60/175,762, filed Jan. 12, 2000, and entitled ENERGY MANAGEMENT SYSTEM FOR AUTOMOTIVE VEHICLE, application Ser. No. 09/564,740 is also a Continuation-In-Part of application Ser. No. 08/962,754, filed Nov. 3, 1997, now U.S. Pat. No. 6,081,098, application Ser. No. 10/046,659 is also a Continuation-In-Part of application Ser. No. 09/575,627, filed May 22, 2000, now U.S. Pat. No. 6,313,608, which is a Continuation-In-Part of application Ser. No. 08/962,754, filed Nov. 3, 1997, now U.S. Pat. No. 6,081,098 the present application Ser. No. 10/200,041 is also a Continuation-in-Part of application Ser. No. 09/816,768 and entitled "MODULAR BATTERY TESTER," filed Mar. 23, 2001, which in turn claims priority to U.S. Provisional Application Ser. No. 60/192,222, filed Mar. 27, 2000, which are incorporated herein by reference in their entirety.

BACKGROUND OF THE INVENTION

The present invention relates to storage batteries and automotive vehicle electrical systems. More particularly, the present invention relates to testing storage batteries and automotive vehicle electrical systems.

Storage batteries are used in automotive vehicles containing internal combustion engines, including hybrid vehicles, as well as in electric vehicles. The storage batteries and electrical systems of such automotive vehicles can fail completely or decay with time. It is desirable to identify an impending failure or diagnose the cause of an existing failure. Further, failures or symptoms related to such failures, can be intermittent and difficult to identify.

Typical diagnostic and troubling shooting techniques related to storage batteries and vehicle electrical systems are performed while the vehicle is located in a shop, test facility or otherwise not under normal operation. Further, intermittent symptoms may not occur during such testing.

Various testing techniques for storage batteries, vehicle electrical systems and related devices are shown and described in U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUN-AWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM, U.S. Ser. No. 09/595,102, filed Jun. 15, 2000, entitled APPARATUS AND METHOD FOR TESTING RECHARGEABLE ENERGY STORAGE BATTERIES; U.S. Ser. No. 09/703,270, filed Oct. 31, 2000, entitled ELECTRONIC BATTERY TESTER; U.S. Ser. No. 09/575,629, filed May 22, 2000, entitled VEHICLE ELECTRICAL SYSTEM TESTER WITH ENCODED OUTPUT; U.S. Ser. No. 09/780,146,filed Feb. 9, 2001, entitled STORAGE BATTERY WITH INTEGRAL BATTERY TESTER; U.S. Ser. No. 09/816,768, filed Mar. 23, 2001, entitled MODULAR BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/483,623, filed Jan. 13, 2000, entitled ALTERNATOR TESTER; U.S. Ser. No. 09/870,410, filed May 30, 2001, entitled INTEGRATED CONDUCTANCE AND LOAD TEST BASED ELECTRONIC BATTERY TESTER; U.S. Ser. No. 09/960,117, filed Sep. 20, 2001, entitled IN-VEHICLE BATTERY MONITOR; U.S. Ser. No. 09/908,389, filed Jul. 18, 2001, entitled BATTERY CLAMP WITH INTEGRATED CIRCUIT SENSOR; U.S. Ser. No. 09/908,278, filed Jul. 18, 2001, entitled BATTERY CLAMP WITH EMBEDDED ENVIRONMENT SENSOR; U.S. Ser. No. 09/880,473, filed Jun. 13, 2001; entitled BATTERY TEST MODULE; U.S. Ser. No. 09/876,564, filed Jun. 7, 2001, entitled ELECTRONIC BATTERY TESTER; U.S. Ser. No. 09/878,625, filed Jun. 11, 2001, entitled SUPPRESSING INTERFERENCE IN AC MEASUREMENTS OF CELLS, BATTERIES AND OTHER ELECTRICAL ELEMENTS; U.S. Ser. No. 09/902,492, filed Jul. 10, 2001, entitled APPARATUS AND METHOD FOR CARRYING OUT DIAGNOSTIC TESTS ON BATTERIES AND FOR RAPIDLY CHARGING BATTERIES; and U.S. Ser. No. 09/940,684, filed Aug. 27, 2001, entitled METHOD AND APPARATUS FOR EVALUATING STORED CHARGE IN AN ELECTROCHEMICAL CELL OR BATTERY; U.S. Ser. No. 09/977,049, filed Oct. 12, 2001, entitled PROGRAMMABLE CURRENT EXCITER FOR MEASURING AC IMMITTANCE OF CELLS AND BATTERIES; U.S. Ser. No. 10/047,923, filed Oct. 23, 2001, entitled AUTOMOTIVE BATTERY CHARGING SYSTEM TESTER, U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER, U.S. Ser. No. 10/042,451, filed Jan. 8, 2002, entitled BATTERY CHARGE CONTROL DEVICE; U.S. Ser. No. 10/042,451, filed Jan. 8, 2002, entitled BATTERY CHARGE CONTROL DEVICE, U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMNICATION; U.S. Ser. No. 60/364,656, filed Mar. 14, 2002, entitled ELECTRONIC BATTERY TESTER WITH LOW TEMPERATURE RATING DETERMINATION; U.S. Ser. No. 10/101,543, filed Mar. 19, 2002, entitled ELECTRONIC BATTERY TESTER; U.S. Ser. No. 10/112,114, filed Mar. 28, 2002; U.S. Ser. No. 10/109,734, filed Mar. 28, 2002; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 10/128,790, filed Apr. 22, 2002, entitled METHOD OF DISTRIBUTING JUMP-START BOOSTER PACKS; U.S. Ser. No. 10/143,307, filed May 10, 2002, entitled ELECTRONIC BATTERY TESTER; which are incorporated herein in their entirety.

SUMMARY OF THE INVENTION

An automotive vehicle electrical system diagnostic apparatus includes a first electrical connection configured to electrically couple to a first terminal of a battery of an automotive vehicle and a second electrical connection configured to electrically couple to electrical wiring of the automotive vehicle. The first and second electrical connections are configured to connect with the battery and the electrical system of the automotive vehicle. Digital sample circuitry is coupled to the connections and is configured to provide a plurality of digital samples during operation of the vehicle which are related to the electrical system and/or storage battery. A memory is configured to store the plurality of digital samples. A method is also provided along with techniques to subsequently analyze the collected samples.

DETAILED DESCRIPTION OF THE PREFERRED EMBODIMENTS

The present invention includes an apparatus and method for testing a battery and/or electrical system of an automotive vehicle using a diagnostic device which is temporarily coupled to the electrical system of the vehicle. While the device is coupled to the vehicle, the vehicle can be driven such that data can be collected while the vehicle undergoes normal operation. The diagnostic device is removed from the vehicle after the testing period and during normal operation. Data collected by the diagnostic device while testing can then be observed or otherwise analyzed in order to identify failures or symptoms of failures in the electrical system and/or battery of the vehicle.

Figure 1:
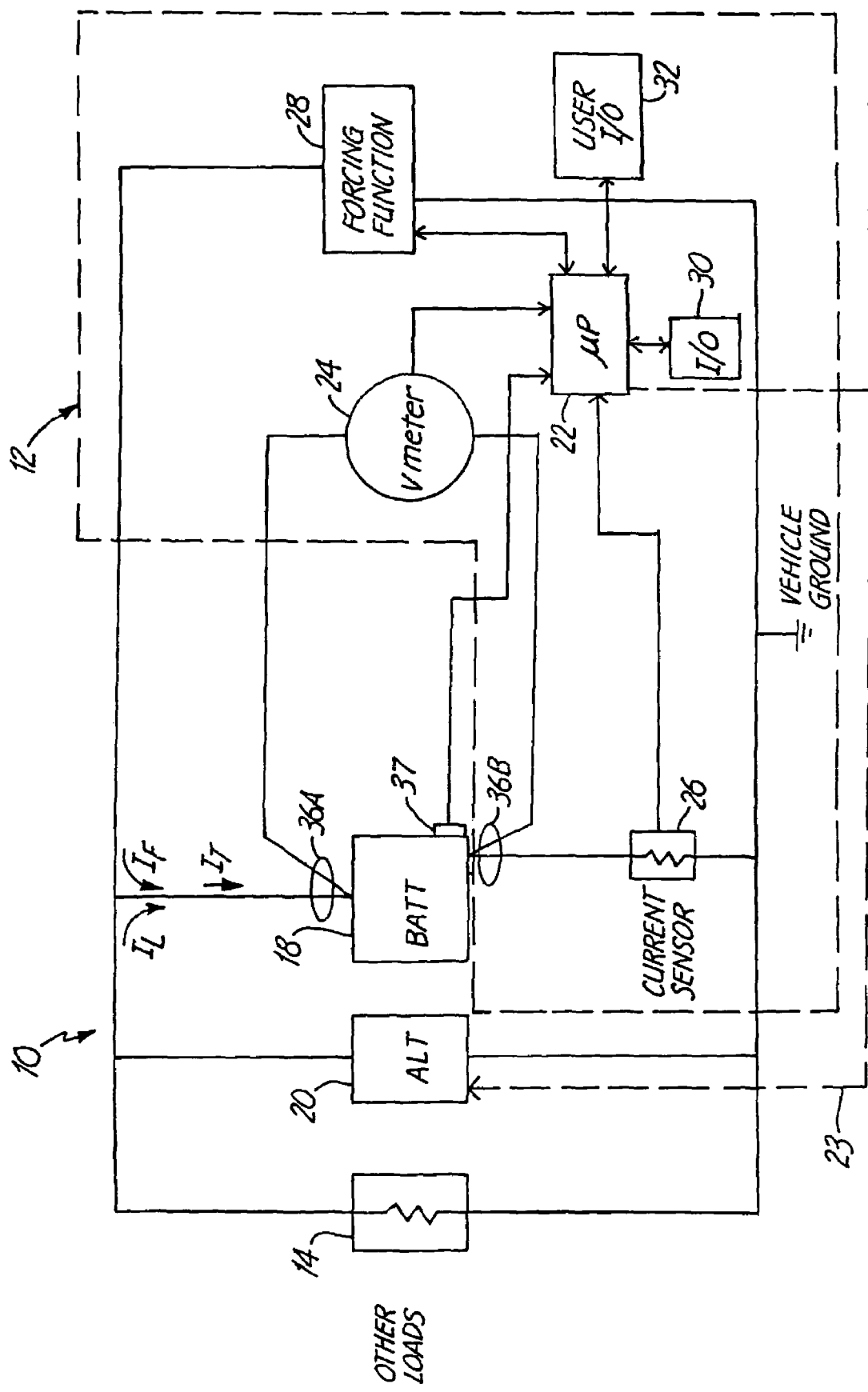
FIG. 1 is a simplified block diagram showing a battery monitor in a vehicle in accordance with one embodiment of the present invention.

FIG. 1 is a simplified block diagram showing an automotive vehicle 10 which includes a battery monitor 12 in accordance with one embodiment of the present invention. Vehicle 10 includes vehicle loads 14 which are shown schematically as an electrical resistance. A battery 18 is coupled to the vehicle load 14 and to an alternator 20. Alternator 20 couples to an engine of the vehicle 10 and is used to charge battery 18 and provide power to loads 14 during operation.

In general, automotive vehicles include electrical systems which can be powered when the engine of the vehicle operates a generator, or alternator. However, when the engine is not running, a battery in the vehicle is typically used to power the system. Thus, the standard generator system in a vehicle serves two purposes. The generator is used to supply power to the vehicle loads, such as lights, computers, radios, defrosters and other electrical accessories. Further, the generator is used to recharge the battery such that the battery can be used to start the vehicle and such that the battery may power the electrical accessories when the engine is not running. Some vehicles do not include internal combustion engines and are completely operated by electrical power.

A standard generator system typically consists of a three phase AC alternator coupled to the engine by a belt or a shaft, rectification diodes and a voltage regulator. These components may exist separately or be part of an integral unit and are typically, somewhat inaccurately, referred to as an "alternator". The voltage regulator is configured such that a constant voltage is supplied by the charging system, regardless of the current being drawn by the electrical system.

The actual load applied to the generator system varies depending upon the number of accessories that are activated and the current required to recharge the battery.

Typical values for the voltage regulator output are between 13.5 and 15.5 volts, depending upon the vehicle manufacturer and particular battery chemistry. Further, the voltage on a specific vehicle can also be compensated for ambient temperature.

This prior art approach has a number of draw backs. The output voltage of the generator must be selected to be high enough to rapidly charge the battery under any condition and regardless of the state of charge of the battery.

Electrical loads on the vehicle are designed to operate at 12.6 volts, the voltage provided by the battery when the engine is switched off. However, these electrical loads must also operate at the higher voltage supplied when the generator system is on. This higher voltage which is impressed upon the electrical system causes higher $I^2R$ (resistive) losses in the loads due to the increased voltage level. This wastes energy and causes the components to heat. This results in reduced life of the electrical circuitry, higher operating temperatures and wasted energy which must ultimately come from the primary fuel source used to operate the engine.

The high voltage across the battery is necessary when the battery's state of charge is low in order to rapidly recharge the battery. However, when the battery's state of charge is within an acceptable range (which occurs most of the time at normal driving speeds), the high voltage across the battery results in high $I^2R$ (resistive heating) losses within the battery resulting in waste of energy, heating of the battery causing premature battery failure, gassing of the battery also resulting in premature failure and heating of electrical components causing premature component failure.

One aspect of the present invention includes the recognition of the aforementioned problems associated with prior art battery charging techniques. In one aspect of the present invention, a battery charging system controller is provided which monitors the condition of the battery under charge and controls the charging system in response to the condition of the battery. With such general aspects of the invention, the particular implementation of the battery monitor and charge control can be selected as appropriate.

In the embodiment illustrated in FIG. 1, battery monitor 12 includes a microprocessor 22 coupled to a voltage sensor 24, a current sensor 26 and a forcing function 28. Microprocessor 22 may also include one or more inputs and outputs illustrated as I/O 30 adapted to couple to an external databus or to an internal databus associated with the vehicle 10. Further, a user input/output (I/O) 32 is provided for providing interaction with a vehicle operator. In one embodiment, microprocessor 22 is coupled to alternator 20 to provide a control output 23 to alternator 20 in response to inputs, alone or in various functional combinations, from current sensor 26, voltage sensor 24 and forcing function 28. In one embodiment, the control output 23 is configured to control alternator 20 such that a nominal voltage output from alternator 20 is 12.6 volts, typical of the nominal open-circuit voltage of the battery 18. Further, microprocessor 22 can raise the output voltage from alternator 20 in accordance with an inverse relationship to the state of charge of battery 18. This can be configured such that alternator 20 only charges battery 18 when necessary, and only charges battery 18 as much as is necessary. This charging technique can increase battery life, lower component temperature of loads 14, increase the lifespan of loads 14 and save fuel. This configuration provides a feedback mechanism in which the state of charge of battery 18 is used to control the charging of battery 18. The battery monitor 12 is easily installed in a vehicle electrical system. A single shunt current sensor 26 must be inserted in one of the primary battery cables and a control line provided to allow control of alternator 20. The control can be by simply adjusting the voltage supplied to a voltage regulator of alternator 20 to thereby control charging of battery 18. The battery monitor 12 can be a separate, self-sufficient and self-contained monitor which operates without requiring interaction with other components of the vehicle, except in some embodiment, alternator 20.

FIG. 1 also illustrates a Kelvin connection formed by connections 36A and 36B to battery 18. With such a Kelvin connection, two couplings are provided to the positive and negative terminals of battery 18. This allows one of the electrical connections on each side of the battery to carry large amounts of current while the other pair of connections can be used to obtain accurate voltage readings. Because substantially no current is flowing through the voltage sensor 24, there will be little voltage drop through the electrical connection between sensor 24 and battery 18 thereby providing more accurate voltage measurements.

In various embodiments, the forcing function 28 can be located physically proximate battery 18 or be connected directly to battery 18. In other embodiments, the forcing function 28 is located anywhere within the electrical system of vehicle 10. In one aspect, the present invention includes an in vehicle battery monitor 12 which couples to battery 18 through a Kelvin connection and further may optionally include a current sensor 26 and may be capable of monitoring battery condition while the engine of vehicle 12 is operated, loads 14 are turned on and/or alternator 20 is providing a charge signal output to charge battery 18. In one particular embodiment, the combination of the Kelvin connection formed by connections 36A and 36B along with a separate current sensor 26 connected in series with the electrical system of the vehicle 10 is provided and allows monitoring of the condition of battery 18 during operation of vehicle 10. The use of an current sensor 26 is used to provide a monitor of the total current $I_T$ flowing through battery 18.

In operation, microprocessor 22 is capable of measuring a dynamic parameter of battery 18. As used herein, a dynamic parameter includes any parameter of battery 18 which is measured as a function of a signal having an AC or transient component. Examples of dynamic parameters include dynamic resistance, conductance, admittance, impedance or their combinations. In various aspects of the invention, this measurement can be correlated, either alone or in combination with other measurements or inputs received by microprocessor 22, to the condition or status of battery 18. This correlation can be through testing of various batteries and may be through the use of a lookup table or a functional relationship such as a characterization curve. The relationship can also be adjusted based upon battery construction, type, size or other parameters of battery 18. Examples of various testing techniques are described in the following references which are incorporated herein by reference U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUN-AWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Patent No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; and U.S. Pat. No. 6,051,976, issued Apr. 18, 2000, entitled METHOD AND APPARATUS FOR AUDITING A BATTERY TEST.

In the specific embodiment illustrated in FIG. 1, the forcing function is a function which applies a signal having an AC or transient component to battery 18. The forcing function can be through the application of a load which provides a desired forcing function in which current is drawn from battery 18, or can be through active circuitry in which a current is injected into battery 18. This results in a current labeled $I_F$ in FIG. 1. The total current, $I_T$ through battery 18 is due to both the forcing function current $I_F$ and the current flowing through loads 14, $I_L$. Current sensor 26 is positioned to sense the total current $I_L$. One example battery dynamic parameter, the dynamic conductance (or reciprocally the battery resistance) can be calculated as:

$$\Delta G = V = \Delta_{I_T}/\Delta V \qquad \text{EQ. 1}$$

where ΔV is the change in voltage measured across the battery 18 by voltage sensor 24 and $\Delta I_T$ is the change in total current measured flowing through battery 18 using current sensor 26. Note that Equation 1 uses current and voltage differences. In one embodiment, the change in voltage and change in current are measured over a period of 12.5 seconds and at a rate of 50 msec to thereby provide a total of 20 readings for ΔV and $\Delta I_T$ every second. The forcing function 28 is provided in order to ensure that the current through battery 18 changes with time. However, in one embodiment, changes in $I_L$ due to loads 14 or the output from alternator 20 can be used alone such that $\Delta I_T = \Delta I_L$ and the forcing function 28 is not required.

In one embodiment, the voltage and current sensors provide synchronized operation, within one microsecond, and are substantially immune to measurement errors due to network propagation delays or signal line inductance. Furthermore, microprocessor 22 can detect a failure of the voltage regulator and alternator 20 if the voltage output exceeds or drops below predetermined threshold levels. This information can be provided to an operator through user interface 32, for example, a "service regulator soon" indication.

A temperature sensor 37 is provided which can be coupled directly to one of the terminals of the battery 18 for measuring battery temperature. The temperature sensor 37 can be used in determining the condition of the battery, as battery condition is a function of temperature and can be used in estimating the amount of power which will be required to start the engine of the vehicle. Any type of temperature sensor can be used, for example, a thermistor, thermocouple, RTD, semiconductor or other temperature sensor.

In one embodiment, current sensor 26 comprises a resistance shunt of 250 μohms and current through the shunt is determined by measuring the voltage drop across the shunt. However, other types of current measurement techniques can also be used such as Hall Effect sensors or through an inductance probe. The change of voltage across the battery and the resultant change in current through the battery is sampled using, for example, one or more analog to digital converters. This information can be correlated to determine the total capacity, such as the total Cold Cranking Amp (CCA) capacity of the battery.

Note that during the measurement cycle, vehicle loads 14 may be applied unexpectedly causing noise to be present in the measurements. One technique which might be considered to reduce the noise is to discard those samples which are outside of a predetermined or adjustable window or are outside of the dynamic range of the analog to digital converter. However, quite unexpectedly it has been found that the accuracy of measurements can be increased by increasing the dynamic range of the analog to digital converters, at the expense of the accuracy of the samples obtained from the converter. By averaging all of the samples, even those which are statistically large or small relative to other samples, the present invention is capable of providing accurate voltage and current measurements even in a noisy environment. By averaging samples, and providing sufficient dynamic range for the analog to digital converter, no samples will be discarded and errors in the measurements will tend to cancel against other errors.

In general, the present invention uses the direct relationship between the dynamic conductance of the battery and the condition of the battery. For example, if a battery drops more than 15% below its rated capacity, microprocessor 22 can provide an output which indicates that the battery 18 should be replaced. Further, the conductance can be used to determine the charge level of the battery. Such a measurement can be augmented to improve accuracy by monitoring the total current flowing into battery 18, or out of battery 18, using current sensor 26. The voltage across the battery 18 can also be used to determine the charge used in the determination of charge level. In general, the state of charge can be determined as a function of various combinations either alone or together of battery state of health, temperature, charge balance (charge going into and out of the battery), charging efficiency and initial conditions such as the battery construction, manufacture, plate configuration or other conditions of the battery.

The functional relationship can be determined by characterizing multiple batteries or through the use of artificial intelligence techniques such as neural networks.

Figure 2:
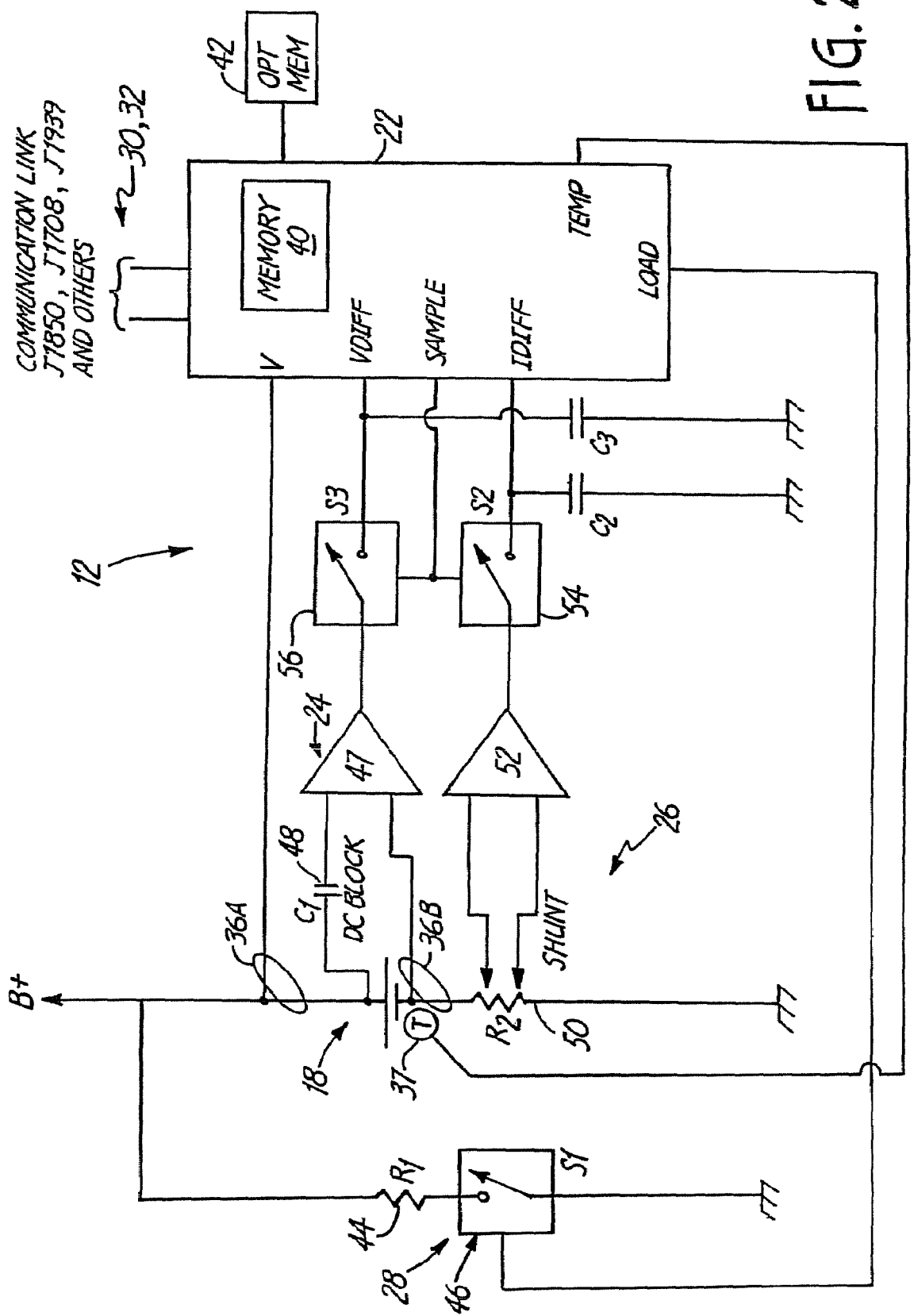
FIG. 2 is a more detailed schematic diagram showing the battery monitor of FIG. 1.

FIG. 2 is a more detailed schematic diagram of battery monitor 12. FIG. 2 shows microprocessor 22 which includes a memory 40. FIG. 2 illustrates I/O 32 with which can be, for specific examples, a communication link in accordance with various standards such as J1850, J1708, J1939, etc. Memory 40 is shown as an internal memory. However, external memory or an optional external memory 42 can also be provided. In general, memory is provided for storing programming functions, ratings, variables, etc. Microprocessor 22 can be a microcontroller or any type of digital circuitry and is not limited specifically to a microprocessor. FIG. 2 illustrates forcing function 28 in greater detail and includes a resistance $R_1$ 44 and a switch $S_1$ 46 controlled by microprocessor 22. Switch 46 can be, for example, a field effect transistor. Voltage sensor 24 is shown as including a differential amplifier 47 coupled to battery 18 through a DC blocking capacitor $C_1$ 48. Shunt 26 is illustrated as a resistance $R_2$ 50 and a differential amplifier 52. Switches $S_2$ 54 and $S_3$ 56 are positioned to selectively couple amplifiers 52 and 47, respectively, to microprocessor 22 and are actuated by a sample control line to provide data samples to microprocessor 22. An analog to digital converter can be an integral part of microprocessor 22 or it can be a separate component to digitize the outputs from amplifiers 47 and 52. Capacitors $C_2$ and $C_3$ provide sample and hold circuits.

Forcing function 28 can be formed by resistance as illustrated in FIG. 2, or by a current sink or through an existing load of the vehicle. Switch $S_1$ 46 can be an FET, or biopolar transistor or can be a mechanical or existing switch in the automotive vehicle. Although shunt 26 is illustrated with a shunt resistance, other types of current sensors such as Hall effect sensors or cable resistance based sensors can be used. Other types of DC blocking techniques can be used to replace capacitancy $C_1$ 48 such as a DC coupled amplifier.

Figure 3:
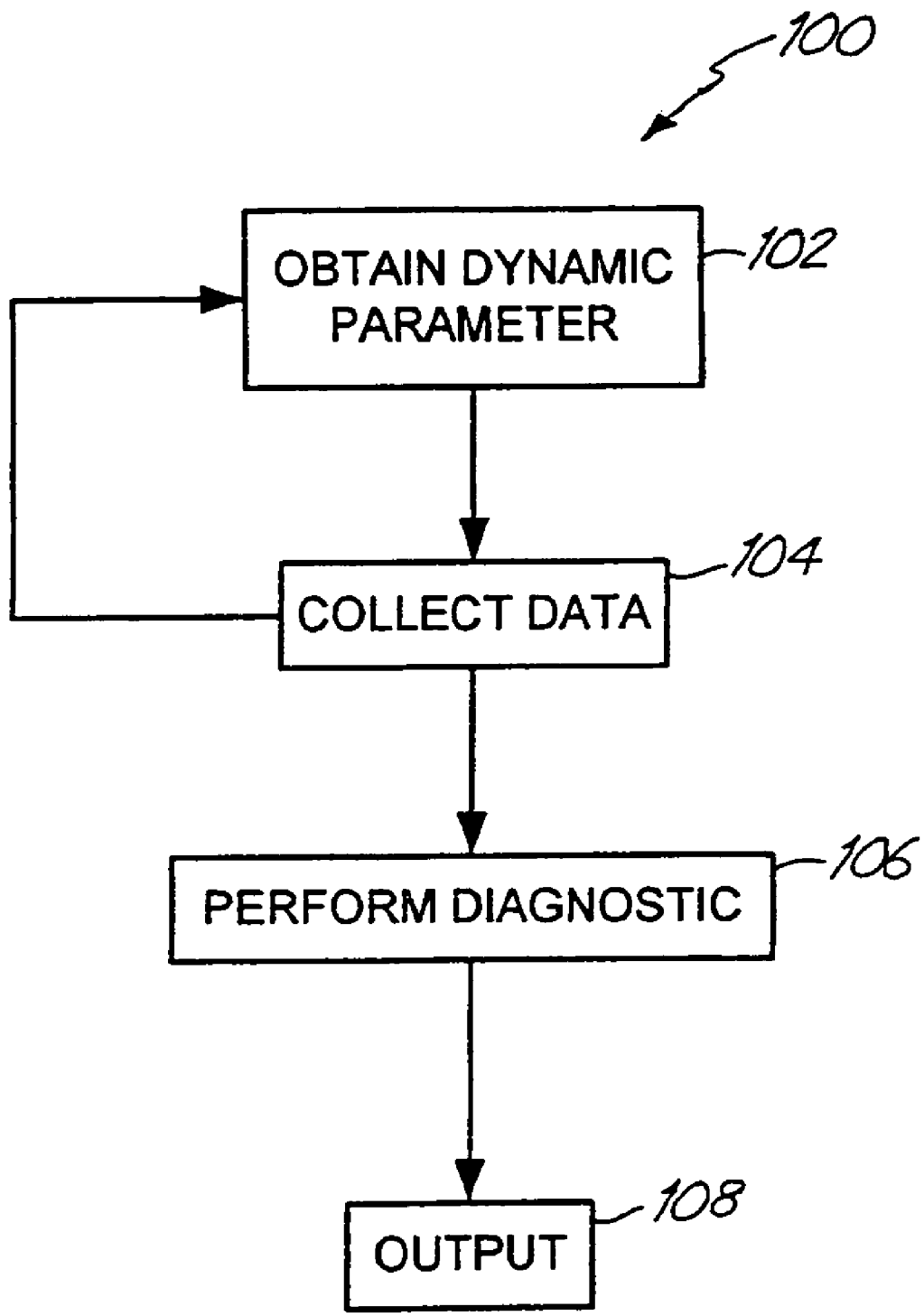
FIG. 3 is a simplified block diagram showing steps in performing diagnostics in accordance with one aspect of the present invention.

FIG. 3 is a simplified block diagram 100 showing diagnostic steps performed by microprocessor 28 in accordance with the invention. At blocks 102 and 104, the dynamic parameter (s) for the battery 18 are obtained and at block 104 data is collected. The type of data collected at block 104 can be any type of data used in determining the condition of the battery. For example, the data can be values used for ΔV and $\Delta I_T$, information related to the type of battery, etc. This information can be stored in memory 40 for subsequent retrieval by microprocessor 22. The data can e collected over any time period and during any type of engine or battery operation. At block 106, microprocessor 22 performs diagnostics based upon the data stored in memory 40. If a battery fault or impending fault is detected, an output can be provided at block 108 such as providing a "service battery soon" indication on the dash of the vehicle 10.

Various aspects of the invention include the particular diagnostics performed by diagnostic block 106. The diagnostics can be simple diagnostics such as a simple if-then rule in which the collected data is compared to various thresholds to provide the diagnostic output. Absolute values of the data can be used for this comparison or various statistical operations can be performed on the data for use in the comparison. For example, averages or standard deviation of the data can be compared to a threshold. The threshold levels can be determined through testing of the vehicle and entered into memory 40 during manufacture. Preferably, when battery 18 is replaced, the thresholds are updated accordingly.

In more advanced embodiments of the diagnostic block 106, microprocessor 22 can perform diagnostics using fuzzy logic, neural networks or artificial intelligence techniques. Neural networks can advantageously be used as they do not require that the battery, alternator and vehicle loads be modeled. Instead, neural networks are capable of learning what "normal" data collected at step 104 should be, and can provide an indication when a pattern of the data is drifting outside of normal operation. Further, the neural network can be "trained" to recognize potential sources of the failure and provide an expected time until the system completely fails. These diagnostic techniques can be selected and implemented such that the operator is warned of an impending failure, prior to the complete failure of the battery 18 or alternator 20.

Figure 4:
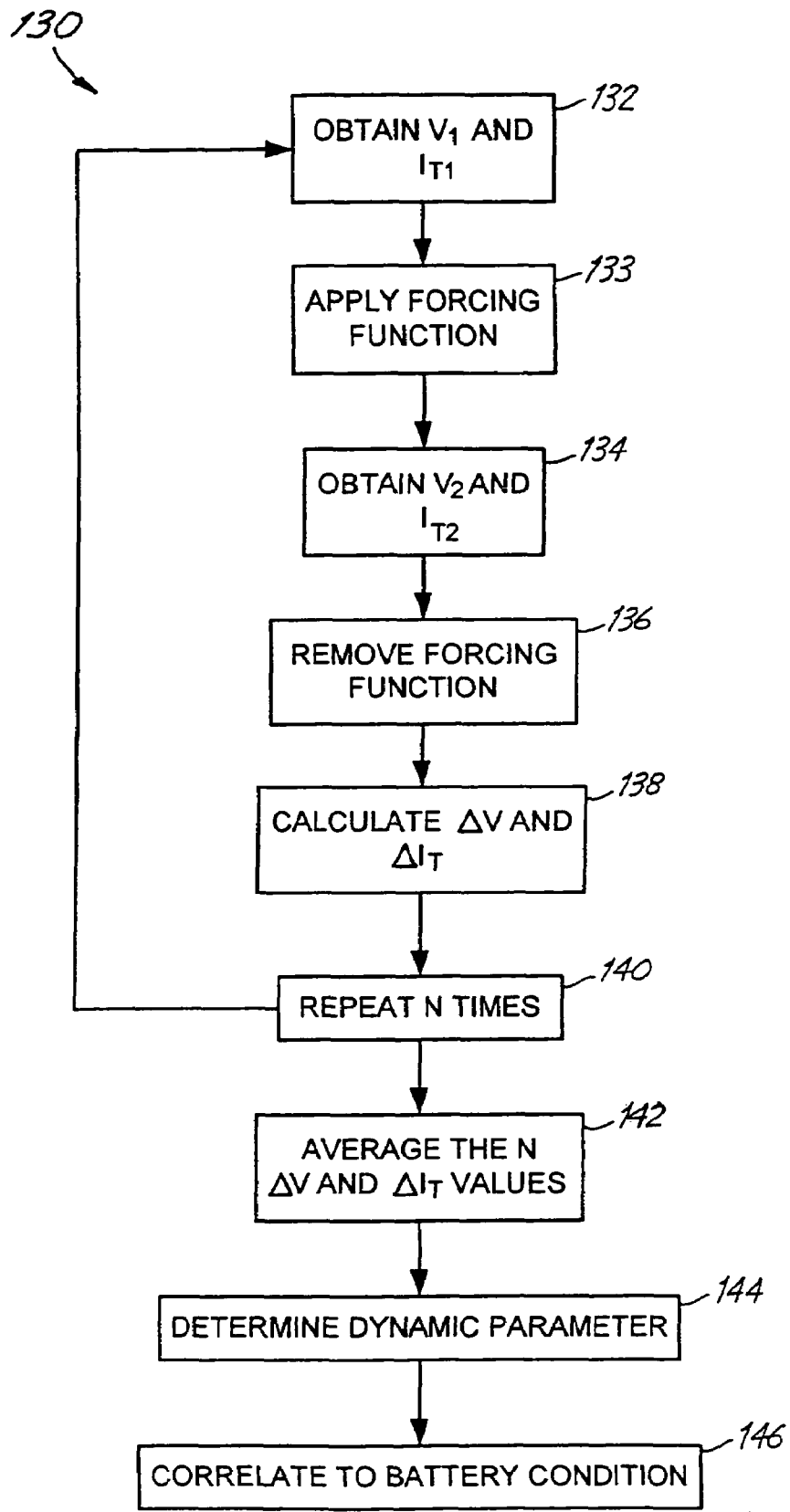
FIG. 4 is a simplified block diagram showing steps in collecting data for use with the present invention.

FIG. 4 is a block diagram 130 showing example steps in accordance with data collection and calculation of a dynamic parameter in accordance with the present invention. Of course, as should be pointed out with respect to all of the flow charts set forth herein, those skilled in the art will recognize that the particular functions of the blocks and the order in which the blocks are executed can be easily rearranged and the invention is not limited to the specific embodiments set forth herein.

In block diagram 130, at block 132 microprocessor 22 obtains an initial voltage $V_1$ across battery 18 using voltage sensor 24 and an initial current $I_{T1}$ through battery 18 using current sensor 26. Next, the forcing function 28 is applied to battery 18 at step 133. At block 134, microprocessor 22 obtains values $V_2$ and $I_{T2}$ with the forcing function applied, and at step 136 the forcing function is removed. Values for $\Delta V$ and $\Delta I_T$ are calculated at step 138. In one example embodiment, the forcing function is applied for a duration of 100 μSec 20 times every second. N values are obtained at block 140. In one example, N is equal to 256. At block 142, the average of $\Delta V$ and $I_{T2}$ for the N samples is calculated and a dynamic parameter for the batter 18 is determined at block 144. This dynamic parameter can be correlated to a condition of the battery at block 146 and displayed on user I/O 32, output through I/O 30 or used to control alternator 20 through alternator control 23.

In one aspect of the invention, the battery monitor performs a state of charge measurement, in real time and regardless of battery polarization, and automatically corrects for the state of health of the battery and the battery temperature. In general, state of health can be determined as a function of the battery conductance and the open circuit voltage across battery 18. For example, the state of health can be determined as:

$$SOH=k_1(G/RATING)*f(V_{OC})-k_2 \quad \text{EQ. 2}$$

where $k_1$ and $k_2$ are constants which are related to the type of battery, G is the measured conductance of the battery, rating is a rating for the battery and $f(V_{OC})$ is a relationship between the state of charge and the open circuit voltage of the battery as set forth in the aforementioned Champlin and Midtronics, Inc. patents. The state of health will range between 0 and 100%. Using the state of health determined by Equation 2, the state of charge (from 0 to 100%) can be determined in accordance with Equation 3:

$$SOC_{t_2} = 100 * \frac{\left| \int_{t_1}^{t_2} i dt \int_{t_1}^{t_2} e(T) dt \int_{t_1}^{t_2} e(i) dt \right|}{(SOH)(AMP-HOURCAPACITY)} + SOC_{t_1} \quad \text{EQ. 3}$$

where $t_1$ is the time at which the state of charge is known (i.e., from the period of overcharge, for example), $t_2$ is the present time, i is the current (amps) in or out of the battery at time t, T is the battery temperature, e(T) is the charge acceptance efficiency at temperature T, and e(i) is the charge acceptance efficiency at current i. Of course, Equations 2 and 3 are simply examples of state of health and state of charge measurements and other techniques can be used in accordance with the invention.

Using the battery state of charge and the battery state of health, battery monitor 12 can predict the starting capabilities of a starter motor of vehicle 10. For example, by comparing the amount of current measured by current sensor 26 which has been previously been required to start the engine of vehicle 10 for a particular temperature, microprocessor 22 can determine if the current state of charge of the battery for the current state of health at the current temperature will be sufficient to provide enough current to start the engine. The performance and any degradation in the starter motor can also be taken into account by microprocessor 22. For example, if the amount of current required to start the engine has been increasing with time, microprocessor 22 can extrapolate and predict what amount of current will be required to start the engine in the future.

Figure 5:
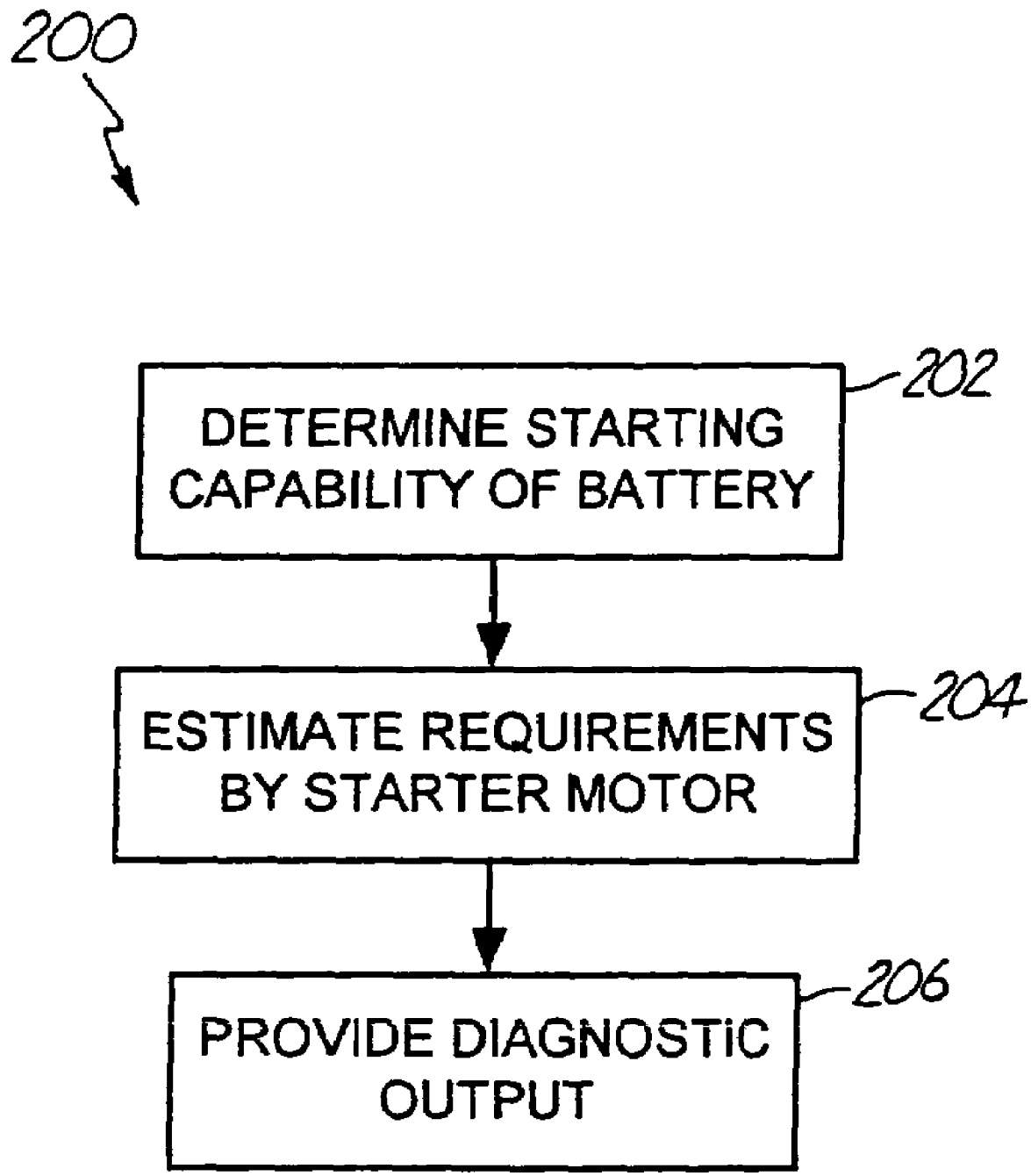
FIG. 5 is a simplified block diagram which illustrates performing diagnostics on a starter motor of the vehicle of FIG. 1.

FIG. 5 is a simplified block diagram 200 which illustrates steps performed by a microprocessor 22 in diagnosing the starting capability of battery 18. At block 202, microprocessor 22 determines the starting capability of battery 18. For example, the starting capability can be an estimation or measurement of the amount of current which battery 18 can supply over a short duration. At block 204, microprocessor 22 estimates the starting requirements of the starting motor of the engine of vehicle 10. For example, the past requirements of the starter motor can be recalled from memory 40 and any trend can be used to predict what will be required for starting the engine. Other inputs can also be used in this determination such as the current temperature. At block 206, a starter diagnostic output is provided. For example, if it appears that the battery will have difficulty in operating the starter motor for a sufficient duration to start the motor of the vehicle, vehicle loads 14 can be selectively switched off by microprocessor 22 through I/O 30. Additionally, a warning can be provided to an operator through user I/O 32 of an impending problem, prior to its actual occurrence, such that the battery 18 can be replaced.

In another aspect of the invention, microprocessor 22 can be adapt or alter the performance of the engine and/or loads 14 based upon a number of different parameters in order to provide optimal charging to battery 18. For example, microprocessor 22 can interface to a data bus of a microprocessor of the vehicle 10 through I/O 30 to control engine operation. Alternatively, microprocessor 22 can be the same microprocessor used to control vehicle operation. The microprocessor 22 can adjust the idle speed of the engine, shift points of the transmission and the load placed on the electrical system by some of the loads 14 to increase or decrease the rate of battery charging based upon the expected driving patterns of an operator. For example, if the microprocessor has observed that the vehicle is normally operated for a short duration, the microprocessor 22 can increase the idle speed of the engine and attempt to reduce loads placed on battery 18 to increase the charging rate of battery 18. Further, microprocessor 22 can alter the shift points of the transmission to cause the engine to operate at a high (or lower) speed than normal. The prediction of engine operation can also be based upon time of day and the day of the week such that repeated driving patterns can be accounted for, for example, commuting to work. Further, in vehicles where it is possible to recognize the operator of the vehicle, such as through the seat position memory in a power seat of the vehicle, microprocessor 22 can alter the charging pattern based upon the driving characteristics of a specific driver.

Figure 6:
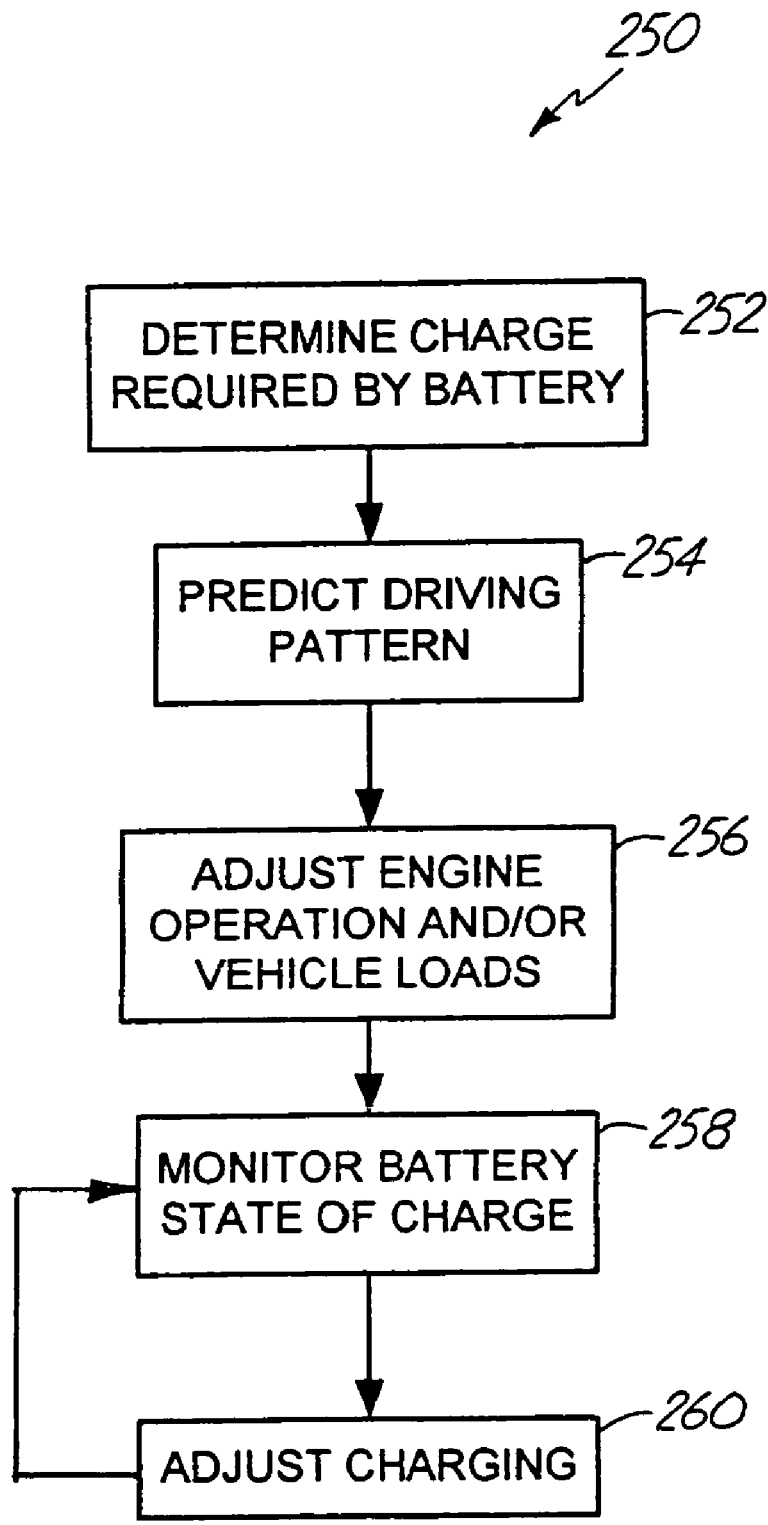
FIG. 6 is a simplified block diagram showing steps related to adjusting the charging profile for charging the battery of the vehicle of FIG. 1.

FIG. 6 is a simplified block diagram flowchart 250 showing steps performed by microprocessor 22 in adjusting engine speed or loads to control the charge in battery 18. Block 252, microprocessor 22 determines the charge required by battery 18 to become fully charged, this determination can be based upon a measurement of the current charge level of battery and a determination of the maximum amount of charge that battery 18 can hold, for example, as a function of the state of health of battery 18. At block 254, microprocessor 22 predicts the expected driving pattern for the upcoming engine use. At block 256, microprocessor 22 adjusts the engine operation and/or vehicle loads 14 in order to optimize the charging of the battery 18 based upon the charge required as determined at step 252 and the driving pattern predicted at step 254. During engine operation, microprocessor 22 continues to monitor the battery state of charge at block 258 and adjusts the charging accordingly at block 260. Once battery 18 has been fully charged, the microprocessor 22 can reduce the charging rate as appropriate.

If the drive cycle is, or has tendency to be, insufficient to charge the battery 18, microprocessor 22 can provide an output to an operator through user I/O 32 to indicate that either the vehicle must be driven for an extended period of time or an alternative charging method be used to charge battery 18. An indication can also be provided as to a prediction regarding how many further such drive cycles can be supported by the battery 18 before it will have insufficient remaining charge to start the vehicle.

Figure 7:
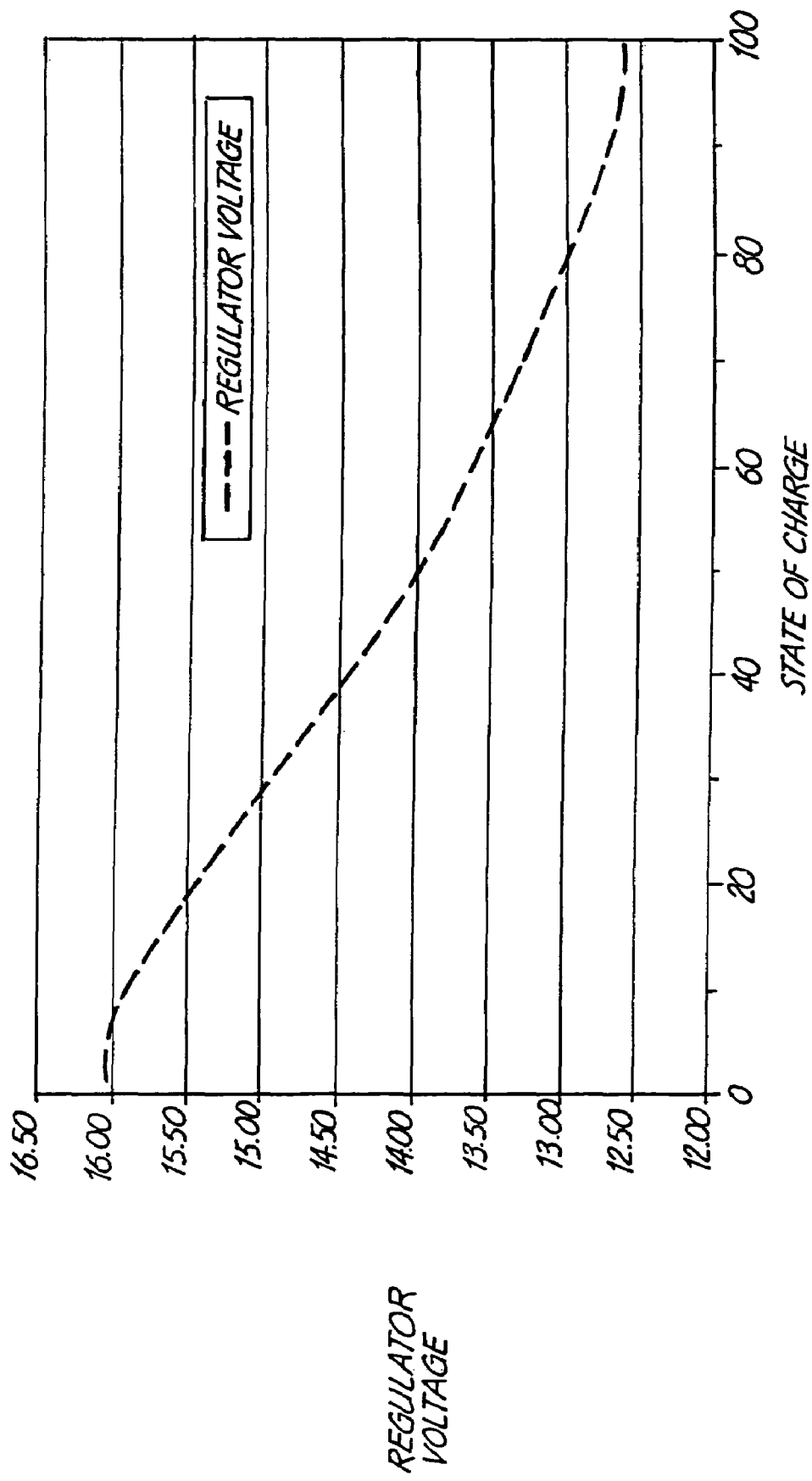
FIG. 7 is a graph which illustrates one sample curve of regulator voltage output versus state of charge for the battery of FIG. 1.

As discussed above, in one aspect of the present invention, the output from the alternator 20 is adjusted based upon the state of charge and/or the state of health determination(s). FIG. 7 is a graph showing the regulator voltage output from alternator 20 as a function of the state of charge of battery 18. As illustrated in FIG. 7, microprocessor 22 reduces the voltage output from alternator 20 as the state of charge of battery 18 increases to 100% charge. The particular profile can be adjusted to a specific battery, alternator and/or engine configuration or to the driving characteristics of an operator. Such a system can significantly reduce or eliminate overcharging of battery 10 and the generation of excessive heat. Further, such a technique can be used to reduce or eliminate the undercharging of battery 10. Additionally, by adjusting the voltage based upon the state of charge, battery 18 and system component life will increase. For example, vehicle loads 14 will be exposed to over voltages for a reduced amount of time. This also allows the various systems components to be optimized for particular charging requirements or voltage levels. In general, the output of the alternator 20 can be reduced and the battery capacity required for a particular vehicle can be reduced because battery charge will be more efficiently maintained. This can reduce overall vehicle weight and improve vehicle mileage. Further still, IR (current-resistance) type losses in the electrical system and overcharging will be reduced thereby reducing the load on the vehicle engine and improving efficiency of the vehicle. In general, this technique will improve vehicle reliability by reducing heat due to excessive IR losses, increasing battery life, providing early detection of impending battery failure and insuring proper vehicle operation even with after market batteries which are used to replace the original battery.

If such a system is implemented when the vehicle is originally manufactured, monitor 12 allows battery management over the entire life of the vehicle. This can be both during assembly and delivery of the vehicle as well as during the lifespan of actual vehicle operation. Additionally, one aspect includes a storage battery 18 with rating information carried in a computer storage device such as a digital memory within a housing of the battery. This data can be communicated to monitor 12 through I/O 30. In one aspect, the electrical connections to the battery are also used as a data communication bus such that monitor 12 can communicate with the storage device in battery 18. The storage device can also be used to store the history, such as the charging and usage history, of battery 18.

Battery monitor 12 can monitor and diagnose operation of alternator 20. For example, a typical alternator provides a multiphase output. By monitoring the data points collected and stored in memory 40, microprocessor 22 can observe the loss of one or more phases in the alternator's output. Similarly, the failure of a rectifying diode in alternator 20 can be detected by microprocessor 22 by observing an asymmetrical ripple pattern. Microprocessor 22 can provide an output to an operator through user I/O 32 such as a "service alternator soon" output. This information can also be communicated to the vehicle microprocessor through I/O 30.

I/O 30 is shown in schematic form and can be any type of input or output and represents, in some embodiments, multiple input(s) and output(s).

Various examples of inputs and outputs include a connection to a databus of the vehicle, a connection to a databus adapted to couple to a diagnostic device such as that provided in service equipment, a connection to a remote vehicle monitoring system, such as one that is capable of coupling through a cellular phone connection of the vehicle. In such an embodiment, the vehicle is capable of recording and reporting information to a remote service such as an emergency assistance service or a service provided to monitor the operation of the vehicle and suggest that maintenance be provided. Various types of inputs and outputs can be provided through direct connections or through non-physical connections such as radio frequency or infrared communication techniques. The particular form of the data and standard used for the inputs and outputs can be selected as proprietary or industry standards. Microprocessor 22 can also be capable of providing advanced reporting and control functions through the use of standardized interfaces such as are available through HTML, XML, or various known or proposed alternatives. In such an embodiment, information collected by microprocessor 22 can be viewed through a "web page" interface provided by a browser. Such an embodiment is advantageous because it can provide a user input/output such as user I/O 32 in a standardized form such that it can be viewed or controlled through many types of standardized devices. In such an embodiment, information can be reported to, or the monitor 12 can be controlled, from a remote location. Additionally, if the vehicle 10 includes a browser type interface which may become commonly available in vehicles, the microprocessor 22 can be controlled and communicate through the vehicle's browser. In one aspect, vehicle monitor includes an IP (Internet Protocol) address such that it is capable of communicating in accordance with the Internet Protocol. When coupled to, for example, a cellular telephone connection of the vehicle, the battery monitor 12 is capable of being monitored and controlled from a remote location coupled through the Internet. However, as mentioned above, such an interface also provides a simple technique for interfacing the monitor 12 with a local computer in the vehicle and displaying information from the monitor 12 for use or control by an operator.

Through the use of the data collected by microprocessor 22 and memory 40, microprocessor 22 is also capable of detecting the imminent failure of the starter motor of the vehicle. For example, by monitoring the voltage drop through the system during starting, microprocessor 22 can determine the average time to start the engine and the average and peak currents required during starting. Changes in these, or other, measurement values can indicate a degrading starter motor. Upon detection of an impending failure, a "service starter motor soon" indication can be provided to an operator through user interface 32.

Microprocessor 22 can provide an indication that the battery 18 has insufficient capacity or substandard performance and alert an operator accordingly. For example, upon power up, such as that which occurs when battery 18 is replaced, microprocessor 22 can measure the capacity of the battery 18 and provide an indication to the operator if the capacity is less than a threshold level determined by the vehicle manufacturer and stored in the memory of the vehicle computer system.

Microprocessor 22 can generate an audit code (or a warranty code) in response to the various tests and data collected. Such codes are described in U.S. Pat. No. 6,051,976, issued Apr. 18, 2000, entitled METHOD AND APPARATUS FOR AUDITING A BATTERY TEST which is assigned to the present assignee and is incorporated herein by reference. In such an embodiment, microprocessor 22 encodes data collected or obtained during its operation. For example, raw data related to a battery test can be obtained and/or the ultimate result of the battery test and subsequently encoded by microprocessor 22. The encoding can be a simple transposition cipher in which the locations and values of various bytes of information are rearranged. Such a code can be designed to prevent falsification of data which can occur where unscrupulous individuals are attempting to submit a falsified warranty claim for a failed component to a manufacturer. This coding technique allows the manufacturer to verify information when a warranty is submitted. Additionally, the information can be used to track operator error and assist in identification and isolation of component failure in order to redesign the components and reduce such failures.

In another aspect, microprocessor 22 is capable of automatically calibrating the measurements obtained from voltage sensor 24 and current sensor 26. Using this aspect of the invention, microprocessor 22 can perform automatic or periodic calibrations to maintain accuracy over the lifespan of the vehicle. Automatic calibration can be provided by selectively switching in calibrated elements having known temperature and time drift characteristics, and using the measured data to correct for instrumentation gains and offsets. For example, a known resistance or voltage source can be selectively coupled to amplifiers 47 or 52. Any offset values from these known values can be stored in memory 40 and used by microprocessor 22 to compensate for errors in measurements.

With the present invention, any polarization of the battery 18 such as that which can result from charging or starting operations, does not produce errors in the measurements performed by microprocessor 22. Specifically, any such errors are eliminated by use of a real-time state of charge algorithm that is independent of the real time battery terminal voltage.

When the engine of vehicle 10 is not operating, microprocessor 22 can enter a sleep mode to reduce current draw and the resultant discharge of battery 18. If desired, microprocessor 22 can periodically "wake up" to perform tests or monitor some aspect of the electrical system of vehicle 10.

A loose or corroded connection to battery 18 can be detected by microprocessor 22 by observing a sudden increase in the resistance across battery 18. An error can be provided to an operator through user interface 32 to alert the operator of the degraded connection.

Microprocessor 22 can also perform diagnostics on the electrical system of vehicle 12 when the engine is not operating. For example, microprocessor 22 can monitor the current being drawn by loads 14 when the engine is not running using current sensor 26. For example, microprocessor 22 can compare the rate of current draw, over a selectable sample period with a threshold stored in memory 40. If the measured rate exceeds the threshold, there may be a fault in the electrical system of the vehicle. Similarly, a small but constant current drain can also indicate a fault which could lead to the discharge of battery 18. Microprocessor 22 can provide an indication to the user through user interface 32 that excessive current draw has occurred while the engine is off. Such current draw can lead to rapid discharge of battery 18 and prevent starting.

Current sensor 26 can also be used by microprocessor 22 to monitor the current flowing into and out of battery 18. The summation of this current, taken over a time period (i.e., integration) can provide an indication that the battery is not receiving sufficient charge, or can provide an indication of the total charge received by battery 18. This information can be displayed to an operator through user I/O 32. Additionally, the information can be provided on I/O 30. If the information indicates that the battery 18 is not receiving sufficient charge, steps can be taken as discussed above, to increase the charging rate of battery 18.

In one embodiment, microprocessor 22 stores information in memory 40 related to the model number, and/or serial number, capacity or other information related to battery 18. In such an embodiment, battery monitor 12 can be a physical part of battery 18 such that battery specific information can be programmed into memory during manufacture. The battery monitor 12 can provide an output to an operator through a display or other type of output device which is physically located on the battery 18. Additionally, the display or user I/O 32 can be located within the vehicle. Input/output 30 can be configured to couple to the databus of the vehicle. For example, the battery 18 can include a data plug adapted to plug into the databus of the vehicle such that monitor 12 can exchange information through the databus. Microprocessor 22 can then report this information to the databus of the vehicle using input/output 30. This allows the microprocessor of the vehicle the ability to perform advanced diagnostics and monitoring as the specific battery type is known.

Figure 8:
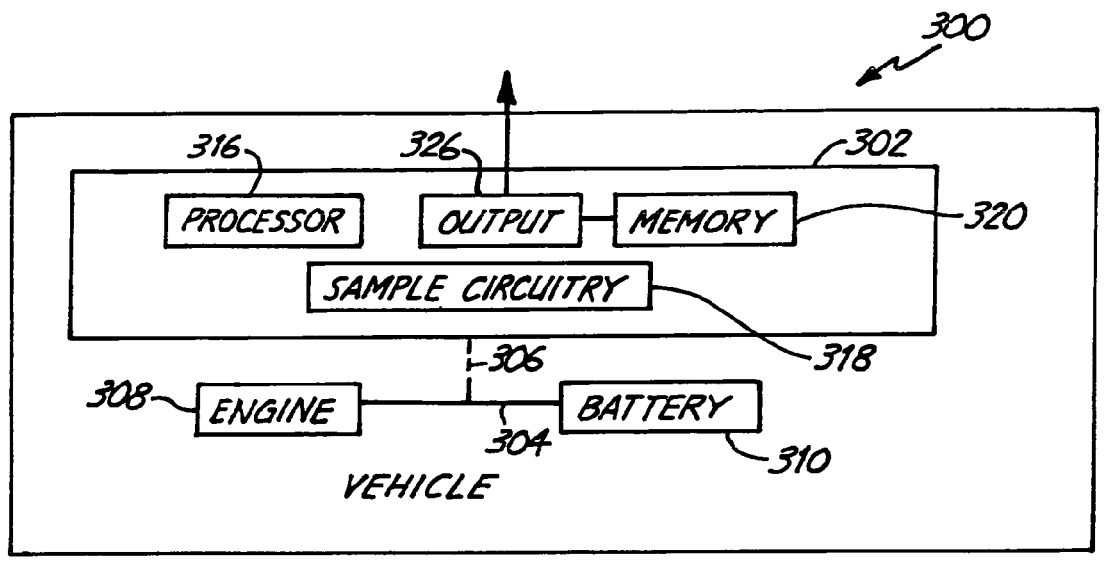
FIG. 8 is a simplified block diagram of a vehicle including a diagnostic device temporarily coupled to the electrical system of the vehicle.

FIG. 8 is a block diagram of a vehicle 300 including a diagnostic device 302 in accordance with another aspect of the invention. Device 302 operates using the battery testing principles, such as those set forth above or others. Device 302 couples to the electrical system 304 of vehicle 300 through a connection 306. Electrical system 304 is shown as coupling vehicle engine 308 to a storage battery 310.

In accordance with this aspect of the present invention, diagnostic device 302 is configured to temporarily couple to electrical system 304 through temporary connection 306. As discussed herein, connection 306 can be a Kelvin connection and/or an inline connection in which diagnostic device 302 is optionally coupled electrically in series with electrical system 304. Diagnostic device 302 includes a processor 316, sample circuitry 318 and memory 320. Sample circuitry 318 collects data samples through connection 306. Information related to the data samples, which may include the data samples themselves, time stamps, data generated as a function of the data samples, etc., is stored in memory 320. Processor 316 controls operation of diagnostic device 302.

Diagnostic device 302 is used to perform in situ testing of battery 310 and vehicle electrical system 304. Device 302 is temporarily coupled to electrical system 304 through connection 306. While device 302 is temporarily coupled to electrical system 304, the vehicle 300 can be operated in a normal manner, or under any condition as desired, such that data is collected and stored in memory 320 through the actual use and operation of the vehicle 300. This can be very useful to a technician in tracking down intermittent problems, or the source of a component failure or degradation. Additionally, this provides a useful research tool for understanding the nature and operation of the vehicle electrical system 304 and battery 310 along with the interaction between battery 310 and the alternator and charging system provided by engine 308. Connection 306 can include an electrical connection to a databus of the vehicle 300 such that data carried on the bus is also stored in memory 320. Such data can provide useful information for subsequent analysis such as the operating parameters of the engine, state of various sensors, engine speed, etc.

Once the in situ testing is complete, device 302 can be removed from the vehicle 300 by disconnecting connection 306. While coupled to vehicle 300 or after removal from vehicle 300, data stored in memory 320 can be recovered from diagnostic device 302 through output 326.

Figure 9:
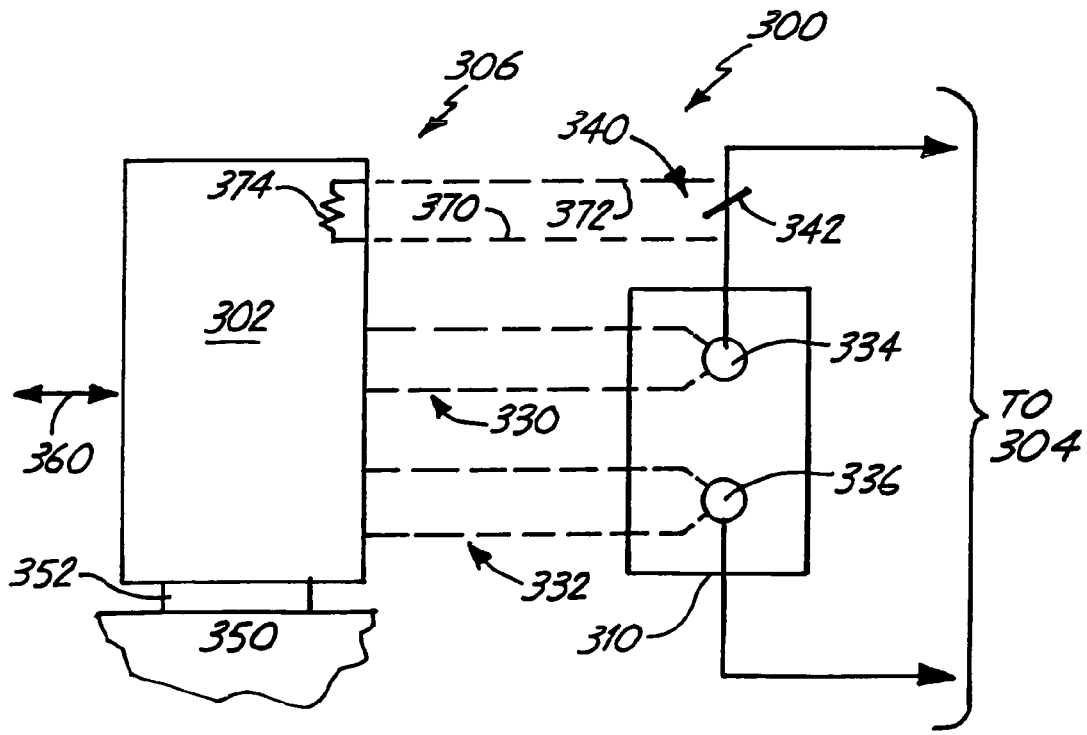
FIG. 9 is a diagram showing the connection of the diagnostic device of FIG. 8 to the vehicle electrical system.

FIG. 9 is a simplified diagram which illustrates connection 306 in greater detail. Connection 306 may include Kelvin connections 330 and 332 configured to couple to terminals 334 and 336, respectively, of battery 310. An inline series connections 340 is also shown. If series connection 340 is used, a break 342 must be provided in the connection between battery 310 and electrical system 304. In various aspects, diagnostic device 302 uses Kelvin connections 330 and 332 or inline series connection 340 alone. In another embodiment, both Kelvin connections 330 and 332 are used along with inline series connections 340.

Inline connection 340 includes first electrical connection 370 and second electrical connection 372 connected in series between battery 310 and vehicle electrical system 304. A low resistance path 374 is provided between connections 370 and 372. The electrical current flowing through the low resistance path 374 can be measured using any appropriate technique and the data stored in inline connection 340 or otherwise used to perform diagnostics.

Physically, diagnostic device 302 can be mounted to, for example, a fixed member 350 of vehicle 300 by a mount 352. For example, mount 352 can be a clamp or some other attachment mechanism including a magnet which issued to secure device 302 to the chassis, engine or some other fixed component of vehicle 300. The Kelvin connections 330 and 332 can be provided through clamps. Depending on the duration of the test or the physical vibrations or other shocks which the vehicle may undergo during operation, the connections 330 and 332 can be through clamps or some other more permanent attachment technique. The clamps can be, for example, spring loaded or screwed together. The inline series connection 340 can be achieved by removing a connection to battery 310. The removed connection is then electrically coupled to diagnostic device 302 and another connection is provided to terminal 334 of battery 310 by a battery clamp coupled to device 302. In one embodiment, series connection 340 does not require a break in the electrical system and is achieved using an induction clamp, hall effect sensor, etc.

Diagnostic device 302 collects data related to a dynamic parameter of battery 310. A forcing function is applied to battery 310 which may include an active or passive signal source in device 302 and can also include signals injected into battery 310 by electrical system 304 of vehicle 300. The sampling rate should be sufficiently fast to ensure enough data is collected to diagnose the battery 310. Data compression techniques can be used when samples are stored.

An input/output connection 360 is provided to diagnostic device 302. The input/output connection 360 can be used to initiate the data collection. In one embodiment, diagnostic device 302 only collects data when the vehicle is operating, which is determined by communication with the databus of the vehicle, or by monitoring the voltage and/or current applied to battery 310 or by some other means.

One type of data which can be collected and stored in the memory are voltage measurements measured across the battery 310. In one embodiment, the connections 330 and 332 illustrated in FIG. 9 are not Kelvin connections and are single wire connections to terminals 334 and 336, respectively. Additional data can be collected such that particular events observed in electrical system 304 and/or battery 310 can be correlated with the operation of the vehicle, for example, as monitored using the databus of the vehicle. In one embodiment, diagnostic device 302 analyzes the collected data and provides an output to an operator which can be used to identify a particular fault with battery 310 or electrical system 308. As discussed above, in another aspect the collected data can be downloaded to a computer or database for subsequent analysis.

In one embodiment, the memory 300 does not contain individual samples and instead contains the result of a diagnostic test. This result is then later retrieved by an operator directly or through a remote computer system.

Although the present invention has been described with reference to preferred embodiments, workers skilled in the art will recognize that changes may be made in form and detail without departing from the spirit and scope of the invention.

What is claimed is:

1. An automotive vehicle electrical system diagnostic apparatus, comprising:

a mount configured to temporarily mount the diagnostic apparatus to the vehicle;

a first Kelvin connection configured to temporarily electrically couple to a first terminal of a battery of an automotive vehicle;

a second Kelvin connection configured to temporarily electrically couple to electrical wiring of the automotive vehicle;

digital sample circuitry coupled to the first and second Kelvin connections configured to provide a plurality of digital samples during operation of the vehicle which are related to a dynamic parameter of the battery measured with the first and second Kelvin connections;

a memory configured to store the plurality of digital samples; and a processor configured to store the digital sample in the memory in response to detection of engine operation, the stored digital sample for subsequent use in diagnosing the vehicle electrical system.

2. The apparatus of claim 1 including first and second series electrical connections configured to measure an electrical current through the battery.

3. The apparatus of claim 1 including a databus connection configured to couple to a databus of the vehicle and wherein the memory is further configured to store data received from the databus.

4. The apparatus of claim 1 including an output configured to provide an output to an operator related to battery condition.

5. The apparatus of claim 1 wherein the stored digital samples are a function of a forcing function applied to the battery.

6. The apparatus of claim 1 including an output configured to output the stored digital samples.

7. The apparatus of claim 1 wherein the mount comprises a magnetic mount.

8. The apparatus of claim 1 wherein the first electrical connection comprises a battery clamp.

9. The apparatus of claim 1 wherein operation of the vehicle is detected based upon a voltage applied to the battery.

10. The apparatus of claim 1 wherein operation of the vehicle is sensed based upon monitoring of a databus of the vehicle.

11. The apparatus of claim 1 including a current sensor configured to sense an electrical current though the battery.

12. The apparatus of claim 11 wherein the current connector is configured to non-invasively couple to a conductor coupled to the battery.

13. A method of diagnosing operation of a vehicle electrical system, comprising:
    temporarily coupling a diagnostic device electrically in series to a battery of a vehicle;
    operating the vehicle;
    detecting operation of an engine of the vehicle and responsively digitally sampling an electrical signal through the series connection to the battery during operation of the vehicle to obtain a plurality of digital samples;
    storing the plurality of digital samples in a memory;
    removing the diagnostic device from the vehicle; and
    analyzing the stored plurality of digital samples following the step of removing.

14. The method of claim 13 including coupling a first and a second battery electrical connections to the battery and measuring a voltage across the battery.

15. The method of claim 14 wherein the battery connections comprise Kelvin connections.

16. The method of claim 13 including connecting to a databus of the vehicle and storing data retrieved from the databus.

17. The method of claim 13 including providing an output to an operator related to battery condition.

18. The method of claim 13 including applying a forcing function to the battery and wherein the stored digital samples are a function of the forcing function applied to the battery.

19. The method of claim 13 including outputting the stored digital samples.

20. The method of claim 13 including mounting the diagnostic device to the vehicle.

21. The method of claim 20 wherein the mounting comprises magnetically mounting.

22. The method of claim 13 including detecting operation of the vehicle based upon a voltage applied to the battery.

23. The method of claim 13 including detecting operation of the vehicle based upon monitoring of a databus of the vehicle.

24. A method of diagnosing operation of a vehicle electrical system, comprising:
    temporarily electrically coupling a first Kelvin connection to a first terminal of a battery of a vehicle;
    temporarily electrically coupling a second Kelvin connection to a second terminal of a battery of a vehicle;
    detecting operation of an engine of the vehicle;
    digitally sampling a signal received from the first and second Kelvin connections in response to detecting operation of the vehicle, the digital samples related to a dynamic parameter of the battery; storing the plurality of digital sampler in a memory;
    removing the diagnostic device from the vehicle; and
    analyzing the stored plurality of digital samples following the step of removing.

25. The method of claim 24 including measuring an electrical current flowing though the battery from the vehicle electrical system.

26. The method of claim 24 including coupling first and second battery electrical connections to the battery and measuring a voltage across the battery.

27. The method of claim 24 including connecting to a databus of the vehicle and storing data retrieved from the databus.

28. The method of claim 24 including outputting an output to an operator related to battery condition.

29. The method of claim 24 including applying a forcing function and wherein the stored digital samples are a function of the forcing function applied to the battery.

30. The method of claim 24 including outputting the stored digital samples.

31. The method of claim 24 including temporarily mounting a diagnostic device to the vehicle which includes the memory.

32. The method of claim 31 wherein the mounting comprises magnetically mounting.

33. The method of claim 24 including detecting operation of the vehicle based upon a voltage applied to the battery.

34. The method of claim 24 including detecting operation of the vehicle based upon monitoring of a databus of the vehicle.

* * * * *

UNITED STATES PATENT AND TRADEMARK OFFICE
CERTIFICATE OF CORRECTION

PATENT NO. : 7,642,787 B2
APPLICATION NO. : 11/585675
DATED : January 5, 2010
INVENTOR(S) : Bertness et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 422 days.

Signed and Sealed this

Sixteenth Day of November, 2010

David J. Kappos
*Director of the United States Patent and Trademark Office*